United States Patent [19]
Wang et al.

[11] Patent Number: 6,038,193
[45] Date of Patent: Mar. 14, 2000

[54] SINGLE ENDED READ SCHEME WITH SEGMENTED BITLINE OF MULTI-PORT REGISTER FILE

[75] Inventors: Yong Wang, Mountain View; Shree Kant, Sunnyvale, both of Calif.

[73] Assignee: Sun Microsystems, Inc., Palo Alto, Calif.

[21] Appl. No.: 09/221,001

[22] Filed: Dec. 23, 1998

[51] Int. Cl.⁷ .................................................. G11C 13/00
[52] U.S. Cl. .................. 365/230.05; 365/230.03
[58] Field of Search ........................ 365/189.04, 189.01, 365/230.03, 230.05

[56] References Cited

U.S. PATENT DOCUMENTS 5,493,536  2/1996  Aoki .................................. 365/230.05

Primary Examiner—Terrell W. Fears
Attorney, Agent, or Firm—Townsend and Townsend and Crew LLP

[57] ABSTRACT

A read system for a multi-ported register file includes a segmented bit line coupled to a global bit line. Each local bit line segment is coupled to a sub-set of the register files in a column to reduce device load and connection load. The local bit line segments are each coupled in series by local sense amps with the local bit line segment coupled to the input of a global sense amplifier. The number of cells coupled to the last bit line segment is more than the number of cells coupled to a bit line segment farthest from the global sense amplifier to balance device and interconnect load and provide for uniform read timing. Both the local bit line segments and global bit line are precharged prior to sensing a bit so that the local sense amplifiers do not require output pull-up transistors. This scheme will not work if the local sense amp includes a pull-up PMOS transistor at its output.

4 Claims, 2 Drawing Sheets

SINGLE ENDED READ SCHEME WITH SEGMENTED BITLINE OF MULTI-PORT REGISTER FILE

BACKGROUND OF THE INVENTION

Differential read schemes with local and global sense amplifiers are quite common in static RAMs. Implementing a differential read scheme in a register file having a large number of registers, where each register is multi-ported, presents additional difficulties if differential sense amps are used due to the efforts required to design sensitive differential sense amplifier circuits. Also, routing interconnect overhead is high for a differential sensing scheme.

Implementing a single ended read scheme is difficult due to the large number of register cells attached to each bit line which results in excessive device load due to the read access transistors' drain capacitance and the high interconnect resistance and capacitance due to the length of a bit line.

Accordingly, a simple and robust scheme for reading a multi-port register file with reduced interconnect overhead is required.

SUMMARY OF THE INVENTION

According to one aspect of the present invention, the array of register file cells is partitioned into a plurality of subsets of rows, with each subset connected to a respective local bit line segment. Each local sense amp in a set local sense amps connects a preceding local bit line segment with a following local bit line segment. The last local bit line segment is connected to the input of a global sense amp. The number of register file cells connected to the last local bit line segment is more than the number of register file cells connected to a local bit line segment farther from the global sense amp to balance the device and interconnect load to improve performance and provide uniform read timing.

According to another aspect of the invention, each local sense amp includes a precharge circuit to precharge the local bit line segment prior to sensing a bit read from a register file cell. An inverter is connected to the local bit line segment and the output of the inverter is connected to the gate of a first pull-down transistor, with the drain of the pull-down transistor connected to the local bit line segment and the source connected to a ground terminal. The global sense amplifier also includes a precharge circuit which precharges the last local bit line segment. A pull-up circuit is not required in the local sense amp as each local bit line segment is precharged by the precharge PMOS in a local or global sense amp.

According to another aspect of the invention, the local sense amplifier includes a second pull-down transistor between the ground terminal and the source of the first pull-down transistor. The gate of the second pull-down transistor is connected to the precharge circuit and rapidly isolates the bit line segment from ground to prevent discharging the bit line when the precharge circuit is activated. By rapidly shutting off the output circuit of the bit line the generation of crowbar current, which could be generated if the sense amp pulled up the last bit line segment while the sense amp attempted in the previous segment tried to pull in down, is prevented.

According to another aspect of the invention, a feedback inverter connected to the output of the local sense amp to the local bit line segment to restore the value of the bit line by providing leakage current to the cells connected to the bit line.

Other features and advantages of the invention will be apparent in view of the following detailed description and appended drawings.

DESCRIPTION OF THE SPECIFIC EMBODIMENTS

A preferred embodiment will now be described with reference to FIG. 1, which is a block diagram of single-ended scheme for reading a multi-ported register file utilizing a segmented bit line architecture.

Figure 1:
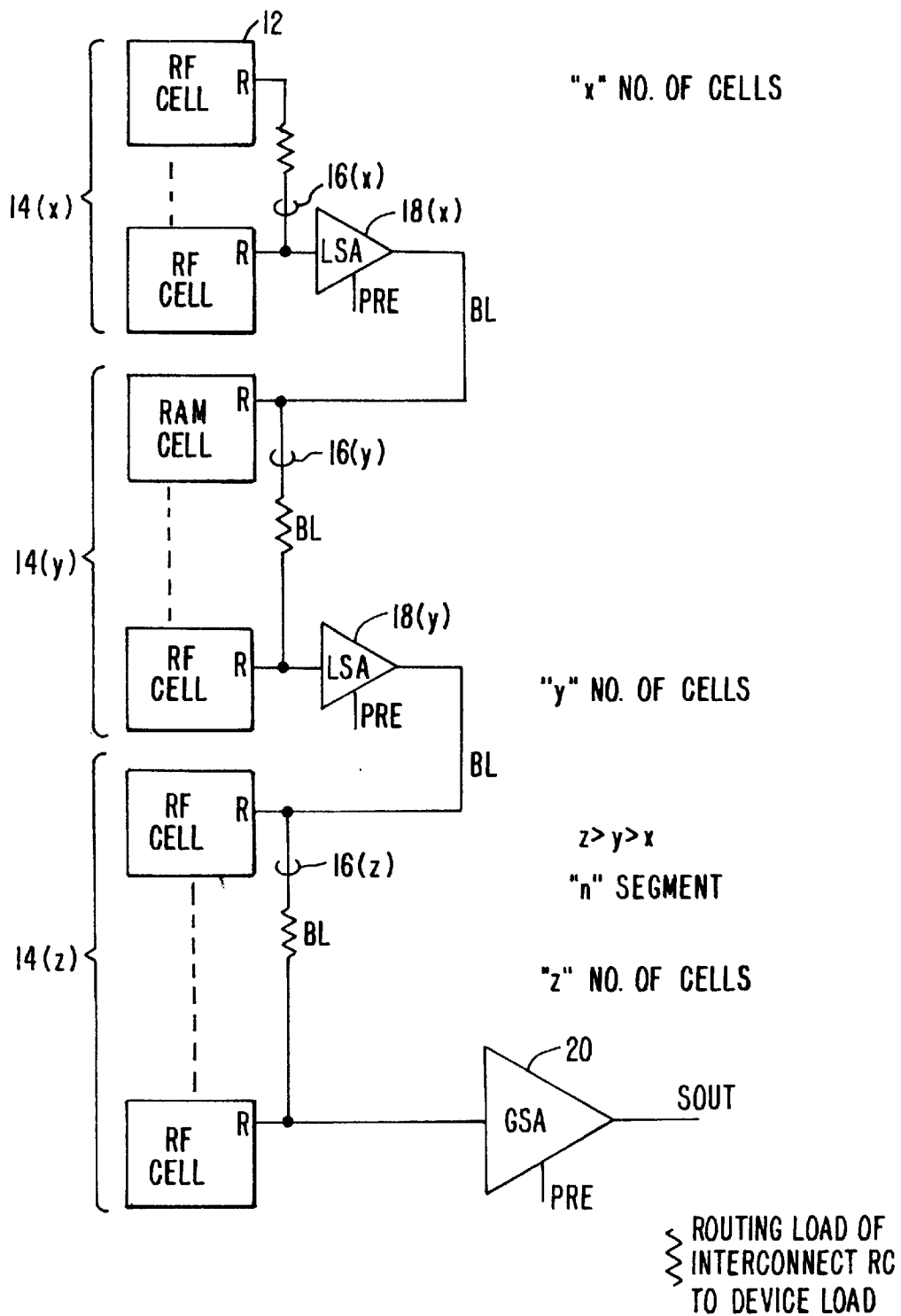
FIG. 1 is a block diagram of a segmented bit line read scheme for a multi-ported register file.

In FIG. 1, one bit line structure of a register file is depicted. Each register file cell (RF CELL) 12 may have several output ports of which only one is depicted in FIG. 1. In a preferred embodiment a 32-bit register file includes RF CELLs 12 arranged in a 128×32 array. Since each RF CELL 12 is multi-ported there is more than one set of 32 bit line structures 10 included in the register file. In a preferred embodiment, the array is broken up into three different sized segments 14(x), 14(y), and 14(z) of 40, 40, and 48 rows respectively.

As depicted in FIG. 1, each segment 14(x, y, and z) is connected to a respective local bit line segment 16(x, y, and z). The bit line segments 14 are connected in series, with the first bit line segment 16(x) connected to the input of a first local sense amp 18(x). The output of the first local sense amp 18(x) is connected to the second local bit line segment 16(y) which is connected to the input of a second local sense amplifier 18(y). The third (last) local bit line segment 16(z) is connected to the output of the second local sense amplifier 18(y) and to the input of a global sense amplifier 20. The output of the global sense amplifier is the output of the multi-ported register file.

The local and global sense amps 18 and 20 precharge the bit line segment connected to their inputs. Thus, each local bit line segment 16 has its own sense amp and precharge. A large number of cells connected to a bit line puts excessive device load, due to read access transistors of the cells, and a large interconnect load due to the load resistance and capacitance of a long bit line. In the above embodiment, the segments farthest from the global sense amp 20 have fewer RFCELLs connected thereto to reduce the device load of the segment farthest from the global sense amp. Thus, the load on each segment is balanced so that read timing is uniform when any RFCELL in register file is read. Data ripples through the local bit line segments and local sense amplifier in each segment when reading a cell in the register file.

Sensing of the data is performed by selecting the RFCELL 12 with a word line (not shown) and amplifying the bit held in the RFCELL 12 utilizing the local sense amp 18. The local sense amp 18 drives its output onto the next bit line segment connected to its output.

Figure 2:
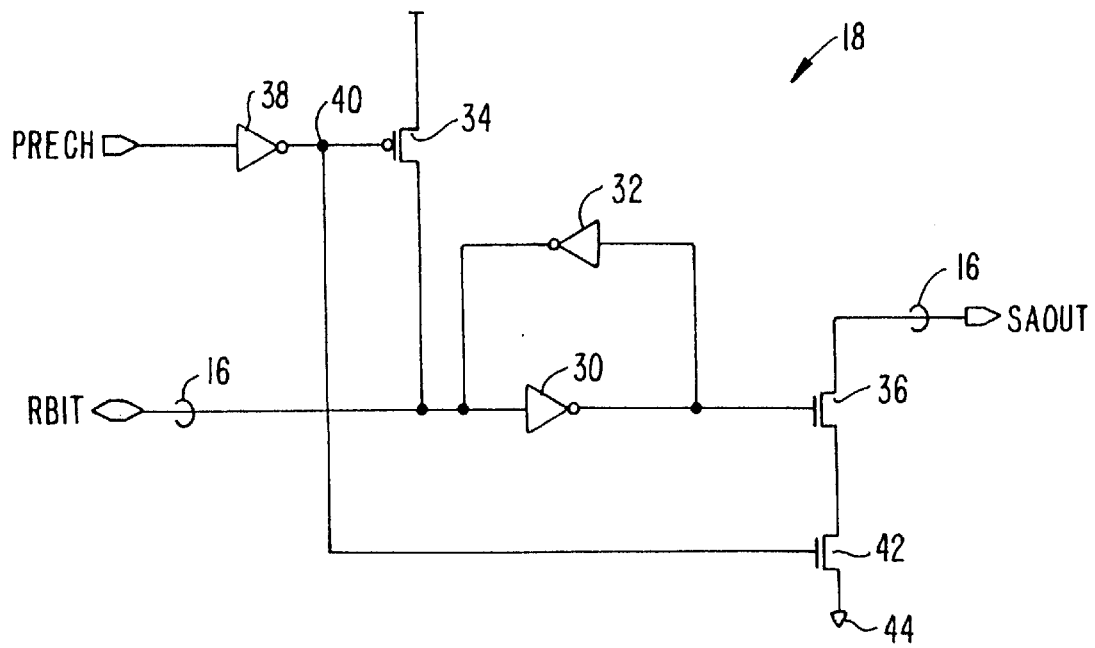
FIG. 2 is a circuit diagram of a local sense amplifier.

The design of the local sense amp 18 will now be described with reference to FIG. 2. In FIG. 2, the local sense amp 18 includes a skewed inverter 30 and a weak feedback inverter 32. The input to the skewed inverter 30 is connected to local bit line segment 16, which transmits the bit read from RFCELL 12 (rbit), and to the output terminal of a precharge PMOS pull-up transistor 34. The output of the skewed inverter 30 is connected to the input of the feedback inverter 32 and the gate of a first NMOS pull-down transistor 36.

A precharge inverter 38 has an input connected to receive a precharge clock (prech) and an output connected to the precharge node 40. The precharge node 40 is connected to the gate of the precharge PMOS pull-up transistor 34 and the gate of a second NMOS pull-down transistor 42.

The first and second NMOS pull-down transistors 36 and 42 form a series circuit, with the drain of the first NMOS transistor 36 connected to the bit line segment 16, its source connected to the drain of the second NMOS transistor 42, and the drain of the second NMOS transistor 42 connected to the ground terminal 44.

Figure 3:
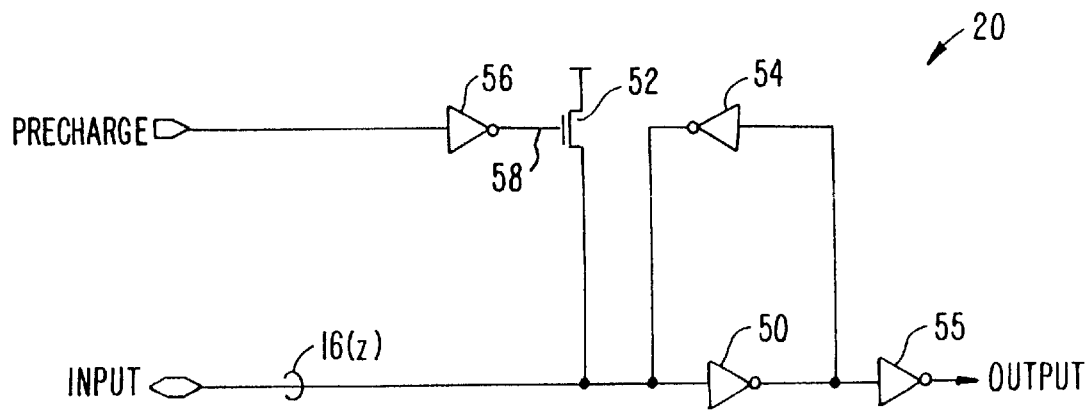
FIG. 3 is a circuit diagram of a global sense amplifier.

The design of the GSA 20 will now be described with reference to FIG. 3. A skewed inverter 50 has its input connected to the last bit line segment 16(z), the output of a pull-up PMOS transistor 52 and the output of a feedback inverter 54. The skewed inverter 50 has its output connected to a driver 55 and the input of the feedback inverter 54.

A precharge inverter 56 has an input connected to receive a precharge clock (prech) and an output connected to a precharge node 58. The precharge node 58 is connected to the gate of the precharge PMOS pull-up transistor 52.

The operation of the local and global sense amplifiers 18 and 20 will now be described. Prior to sensing the bit, the local bit line segments 16 are precharged to $V_{DD}$ by the pull-up PMOS transistors 34 and 52 in the local and global sense amps 18 and 20 respectively. The second pull-down NMOS transistor 42 in the local sense amp 18 prevents crowbar current which could be generated by the pulling up of the bit line segment by the sense amp in the next segment while the sense amp of the previous segment is simultaneously pulling down the bit line segment 16. The first pull-down transistor might turn off late due to delay through the skewing inverter 30 of the local sense amp 18. The second pull-down transistor 42 is turned off directly by the precharge node 40 without substantial delay.

Because bit line segments 16 are precharged, only a low signal needs to be sensed. The trip point of both skewed inverters 30 and 50 is skewed toward $V_{DD}$ to speed up sensing of a low rbit.

Both the local sense amp and GSA 18 and 20 include a weak feedback inverter 32 and 54 connecting the output of the skewing inverter to the bit line connected to the input. This feedback inverter provides current to offset the leakage current and maintain the bit line value.

The invention has now been described with reference to the preferred embodiment. Alternatives and substitutions will now be apparent to persons of skill in the art. In particular, the polarities of signals, type of transistors, or transistor sizes depicted in FIGS. 2 and 3 are not critical to the practice of the invention. Further, the single-ended read scheme is useful in other SRAM applications that require reduced routing interconnect and robust sense amplifier circuits of simple design. Also, although particular numbers of cells in each subset of cells were described with reference to a preferred embodiment, the number of cells in each subset will vary depending on the design of the register file. Accordingly, it is not intended to limit the invention except as provided by the appended claims.

What is claimed is:

1. A system for reading data from a multi-ported register file of the type including an array of rows and columns of register file cells, which each port of a register file in one of the rows coupled to a bit line, said system comprising:

a first plurality of bit line segments, each coupled to a subgroup of the rows of register file cells in the array, with each subgroup including a designated number of register file cells;

a second plurality, being one less than the first plurality, of local sense amplifiers, each local sense amp having an input coupled to a respective preceding local bit line segment and an output coupled to a following local bit line segment to coupled said bit line segments in series, with each local sense amplifier having a precharge circuit of precharging the preceding local bit line prior to sensing a bit read from a register file cell in the array coupled to the bit line segment, and having an output port for providing a output signal determined by the value of a sensed bit;

a global sense amp, having an input coupled to a last local bit line segment line and having a precharge circuit for precharging the last bit line segment prior to sensing a signal on the last local bit line segment, with the designated number of register files cells connected to the last bit line segment being less than the designated number of register file cells connected to another of the bit line segments.

2. The system of claim 1 where said local sense amp further comprises:

an inverter, having an input connected to the local bit line segment, and an output;

a first pull-down transistor, having a gate connected to the output of the inverter, a drain connected to the global bit line, and a source;

a second pull-down transistor, having a gate connected to the precharge circuit, a drain connected to the source of the first pull-down transistor, and a source connected to ground so that signal delay of the inverter will not cause the first pull-down transistor to pull down the global bit line when it is being precharged.

3. The system of claim 1 where said local sense amp further comprises:

a feedback inverter, coupling the output of the skewed inverter to the local bit line segment to restore the value of the bit line by providing a leakage current to the bit line.

4. The system of claim 2 wherein said inverter has a trip point skewed towards the supply voltage to more quickly sense a falling input signal.

* * * * *

UNITED STATES PATENT AND TRADEMARK OFFICE
CERTIFICATE OF CORRECTION

PATENT NO. : 6,038,193
DATED : Mar. 14, 2000
INVENTOR(S) : Yong Wang and Shree Kant It is certified that error appears in the above-indentified patent and that said Letters Patent is hereby corrected as shown below:

In column 4 at line 7, delete "which" and insert therefor --with-.
In column 4 at line 22, delete "a" and insert therefor --an--.

Signed and Sealed this

Third Day of April, 2001

Attest:

NICHOLAS P. GODICI

*Attesting Officer*     *Acting Director of the United States Patent and Trademark Office*